United States Patent [19]

Sullivan et al.

[11] Patent Number: 5,101,150

[45] Date of Patent: Mar. 31, 1992

[54] AUTOMATIC CIRCUIT TESTER WITH SEPARATE INSTRUMENT AND SCANNER BUSES

[75] Inventors: Robert C. Sullivan, Stow; Brian J. Sargent, Dunstable; Robert H. Pincus, Andover; Rudy D. Pietrantoni, Natick, all of Mass.

[73] Assignee: GenRad, Inc., Concord, Mass.

[21] Appl. No.: 660,289

[22] Filed: Feb. 22, 1991

[51] Int. Cl.$^5$ .............................................. G01R 1/02
[52] U.S. Cl. ................................ 324/158 F; 324/72.5; 324/73.1; 371/15.1
[58] Field of Search ................. 324/158 F, 72.5, 73.1; 371/22.1, 15.1, 116.1; 361/412, 413, 415

[56] References Cited

U.S. PATENT DOCUMENTS

| | | | |
|---|---|---|---|
| 4,517,512 | 5/1985 | Petrich et al. | 371/22.1 |
| 4,622,647 | 11/1986 | Sagnard et al. | 371/22.1 |
| 4,689,721 | 8/1987 | Damerow et al. | 361/398 |
| 4,707,834 | 11/1987 | Frisch et al. | 371/15.1 |
| 4,736,374 | 4/1988 | Kump et al. | 324/73.1 |
| 4,746,855 | 5/1988 | Wrinn . | |
| 4,758,780 | 7/1988 | Coon et al. | 324/158 F |
| 4,764,925 | 8/1988 | Grimes et al. | 324/73.1 |
| 5,001,422 | 3/1991 | Dahlberg et al. | 324/73.1 |
| 5,032,789 | 7/1991 | Firooz et al. | 324/73.1 |

FOREIGN PATENT DOCUMENTS 0151570  9/1983  Japan .............................. 324/158 F

OTHER PUBLICATIONS

"HP75000 Family of VXI Products," Hewlett Packard brochure, Fall and Winter, 12/1989.
"Instruments & Systems" catalogue, Racal-Dana Instruments, Inc, 12/1988.

Primary Examiner—Kenneth A. Wieder
Assistant Examiner—William J. Burns
Attorney, Agent, or Firm—Cesari & McKenna

[57] ABSTRACT

An automatic circuit tester (10) employs a scanner (20) embodied in a group of interconnected scanner boards (46, 47) that provide switching by means of mechanical relays. The scanner boards plug simultaneously into respective instrument boards (44) and into a common scanner bus (50) separate from an instrument bus (38) that carries the signals that control the instruments on the instrument boards (44). The scanner bus provides a common pathway for signals to travel between instruments or system pins to which one scanner board is connected and those to which another is connected. It also provides scanner-control paths so that the instrument boards to which the scanner boards are connected to not need to provide such paths and thus do not need to be custom-designed for the particular tester in which they are used.

3 Claims, 13 Drawing Sheets

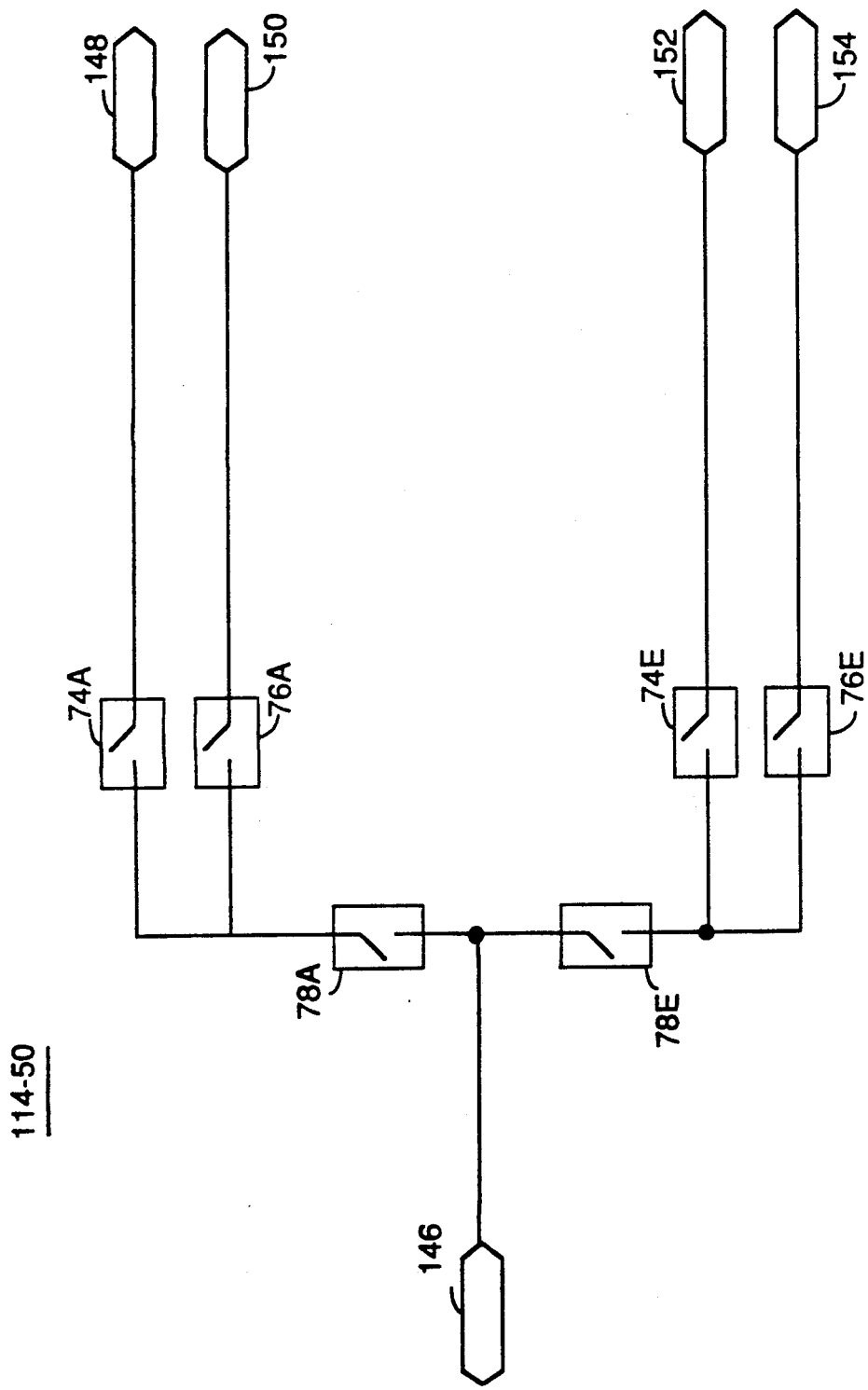

AUTOMATIC CIRCUIT TESTER WITH SEPARATE INSTRUMENT AND SCANNER BUSES

BACKGROUND OF THE INVENTION

The present invention is directed to automatic circuit testers and in particular to an arrangement for interconnecting test instruments to the tester's system pins.

A typical automatic circuit tester typically employs a "bed of nails" fixture, which includes a large number of spring-loaded probes ("nails") that contact test points on the device under test ("DUT"), typically a circuit board, at a large number of test points. These nails are in turn connected to instruments that drive or sense signals at the test points.

Although complete testing of a particular circuit board may require that connections be made between test instruments and a large number of test points on the board, the number of test instruments required in the automatic test equipment typically is only a small fraction of the total number of possible board test points, since only a fraction of the test points are typically in use in any given part of the test. The test instruments can therefore be multiplexed.

In an automatic circuit tester, the apparatus for performing this multiplexing and related switching is referred to as a scanner. The scanner is typically embodied in circuit boards that plug into the fixture along one edge and receive on their other edges signals that operate the scanner switches.

Historically, the circuit boards that carry the scanner switches have also included the instruments that the scanners couple to the DUT. This approach has operational advantages, since the instruments and their associated scanners should be kept as close to each other as possible. More recently, however, the marketplace has exhibited some resistance to this approach because it "locks the buyer in" to the use of instruments that the tester manufacturer supplies. The automatic-test-equipment industry has accordingly responded by moving toward "open architecture," in which different test-equipment manufacturers implement a common instrument-control protocol. They provide sockets that can be used by instruments manufactured by other suppliers so long as those instruments conform to the common protocol.

The instrument boards therefore do not include the (system specific) scanners. As a result, the user bears the burden of making the proper connections between the instrument and the various test points. He usually does this by providing multiplexer boards, typically also plugged into sockets that operate in accordance with the common control protocol, and wiring leads from the "front-panel" edge of the instrument board to the multiplexer board, which selectively connects the instrument input or output port to desired test points. The user can thus employ the same instrument for different test points at different parts of a test.

We have recognized, however, that the theoretical resultant flexibility yields practical inconvenience. The number of instruments and test points to which they need to be directed does not have to be very large before the necessary wiring between instruments and multiplexers becomes unwieldy. And even with the multiplexing, rewiring often proves to be necessary when tests are changed.

SUMMARY OF THE INVENTION

We have found that these difficulties can be greatly reduced in a system that provides a scanner bus separate from the control bus that controls the instruments. This enables the scanner switches to be provided on scanner boards connected to respective instrument boards and arranged to couple the inputs or outputs of their respective instrument boards to the scanner bus. Since all scanner boards are connected to the receiver for coupling to respective DUT test locations, the scanner bus can be used to couple a test point associated with one scanner board to an instrument associated with a different scanner board. This greatly enhances the flexibility of the system and avoids the unwieldy wiring that conventional approaches necessitate.

The accompanying claims define the invention more precisely.

BRIEF DESCRIPTION OF THE DRAWINGS

These and further features and advantages of the invention are described in connection with the accompanying drawings, in which:

FIG. 12 is a schematic diagram of the interconnection of the relays on auxiliary boards of the type depicted in FIG. 11.

DETAILED DESCRIPTION OF AN ILLUSTRATIVE EMBODIMENT

Figure 1:
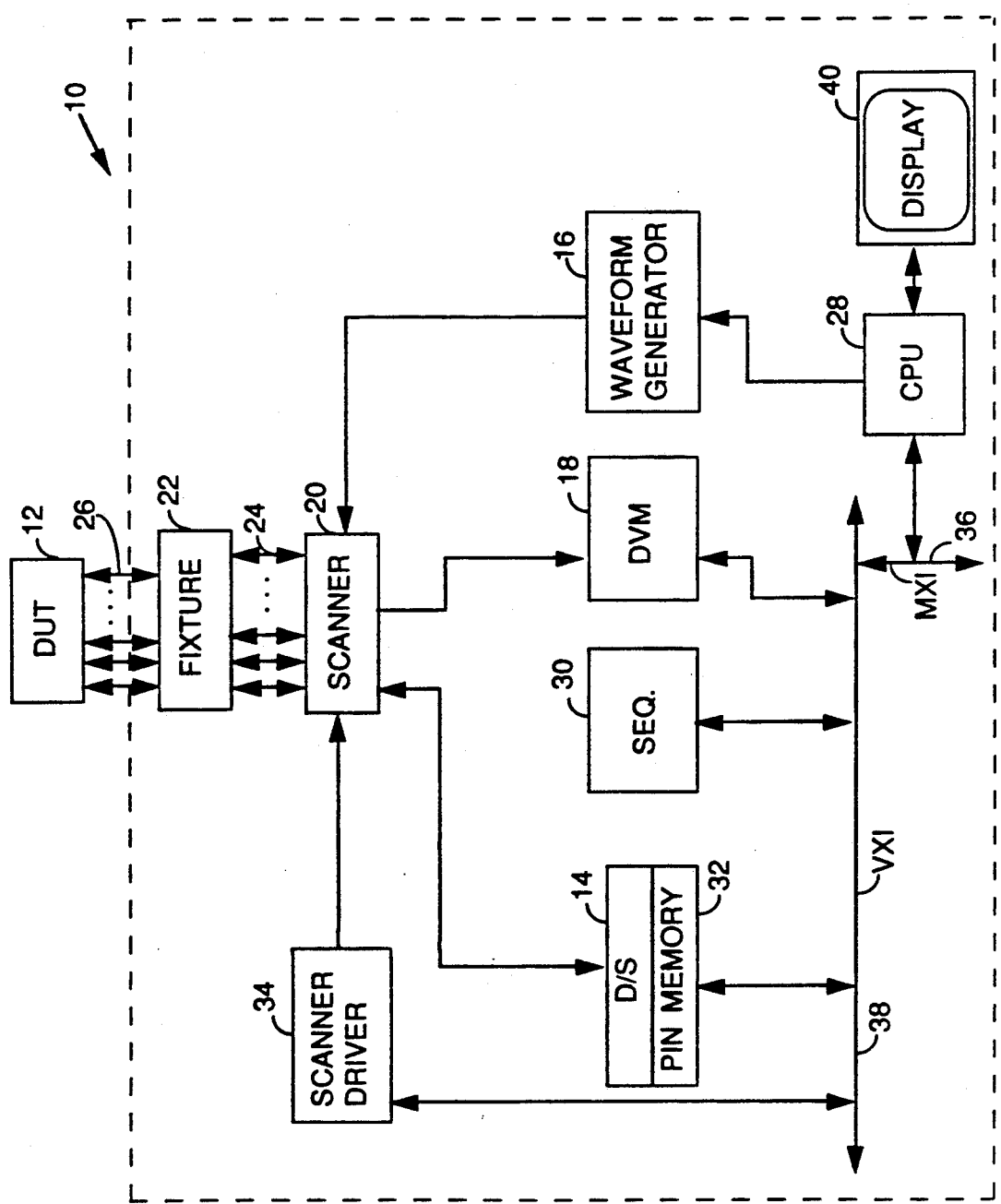
FIG. 1 is a block diagram of an automatic circuit tester that employs the teachings of the present invention.

FIG. 1 represents in block-diagram form one of the many types of automatic circuit testers in which the teachings of the present invention can be employed. The tester 10 tests a device under test (DUT) 12 by using digital test instruments in the form of driver/sensors 14 to apply signals to the DUT and observe the resulting signals that appear on the DUT. In addition to the digital instruments 14, a tester may also use analog instruments, such as a waveform generator 16 or a digital voltmeter 18.

To connect the test instruments to the DUT 12, typical automatic test equipment employs a scanner 20 and a fixture 22. The scanner 20 provides a large number of fixed-position system pins 24, and these pins are used to carry signals to and from the DUT. However, they are not physically positioned to line up with test points on any particular circuit board, and signals on the system pins 24 have to be directed to different physical positions for every board type or family. This is the purpose of the fixture 22, which provides connections between the system pins 24 and fixture pins ("nails") 26 specifically positioned for the desired test points on the DUT 12.

For many DUTs, the number of necessary nails 26 is very large, but only a small number of them are employed at any one time. For instance, a DUT may have a large number of components, which in total require a large number of test points, but each test of an individual component or circuit may involve only the test points that electrically communicate with the particular terminals of that component or circuit and a few others, whose operation must be affected in order to isolate that component or circuit. In testing that particular component or circuit, the tester leaves all other test points idle. Subsequently, when the system tests other components or circuits on the board, it uses another small subset of the test points and thus another small subset of the nails 26.

Since each part of the test requires only a small subset of all of the nails 26, only a small subset of the system pins 24 are typically employed in any part of the test. In many cases it would therefore be wasteful to provide a separate test instrument dedicated to each system pin 24. This is particularly true of analog instruments, such as digital volt-meters 18 and waveform generators 16, since the number of such instruments used at a time is usually much smaller than that of the driver/sensors 14. The tester therefore includes the scanner 20, which is a matrix of switches and other circuitry that switches the connections between instruments and system pins 24 between bursts so that individual instruments can be used for different nails for different parts of a test.

The control circuitry for the tester may be embodied in a computer 28, a sequencer 30, and a scanner driver 34. To set the tester up for a burst, the computer 28 communicates with the scanner driver 34 by means of, for instance, industry-standard MXI and VXI buses 36 and 38 to specify the connections that the scanner 20 is to make between the instruments and the system pins 24. The scanner driver 34 responds by applying scanner-control signals to the scanner by means of a separate scanner bus to be described below. The VXI bus also serves as an instrument bus, carrying instrument-control signals such as those by which the computer 28 loads a pin memory 32 with values representing the signals that the individual test points are to receive or are expected to produce during the burst. The computer 28 may similarly program an analog instrument such as the digital voltmeter 18 if such an instrument is included as a standard part of the tester. Alternatively, an analog instrument such as the waveform generator 16, which may not be an ordinary part of the system and is not plugged into the VXI bus, may be connected to the scanner 20 and programmed separately, possibly by the computer 28.

For real-time control during the actual burst, the computer 28 turns control over to the high-speed sequencer 30, which clocks the driver/sensors 14 and the pin memory 32 and may control other instruments as well.

When the burst has been completed, the computer 28 reads the results from the pin memories 32 and, for instance, the digital voltmeter 18 and uses appropriate equipment such as a display 40 to produce an indication of the results, either then or after further bursts.

Figure 2:
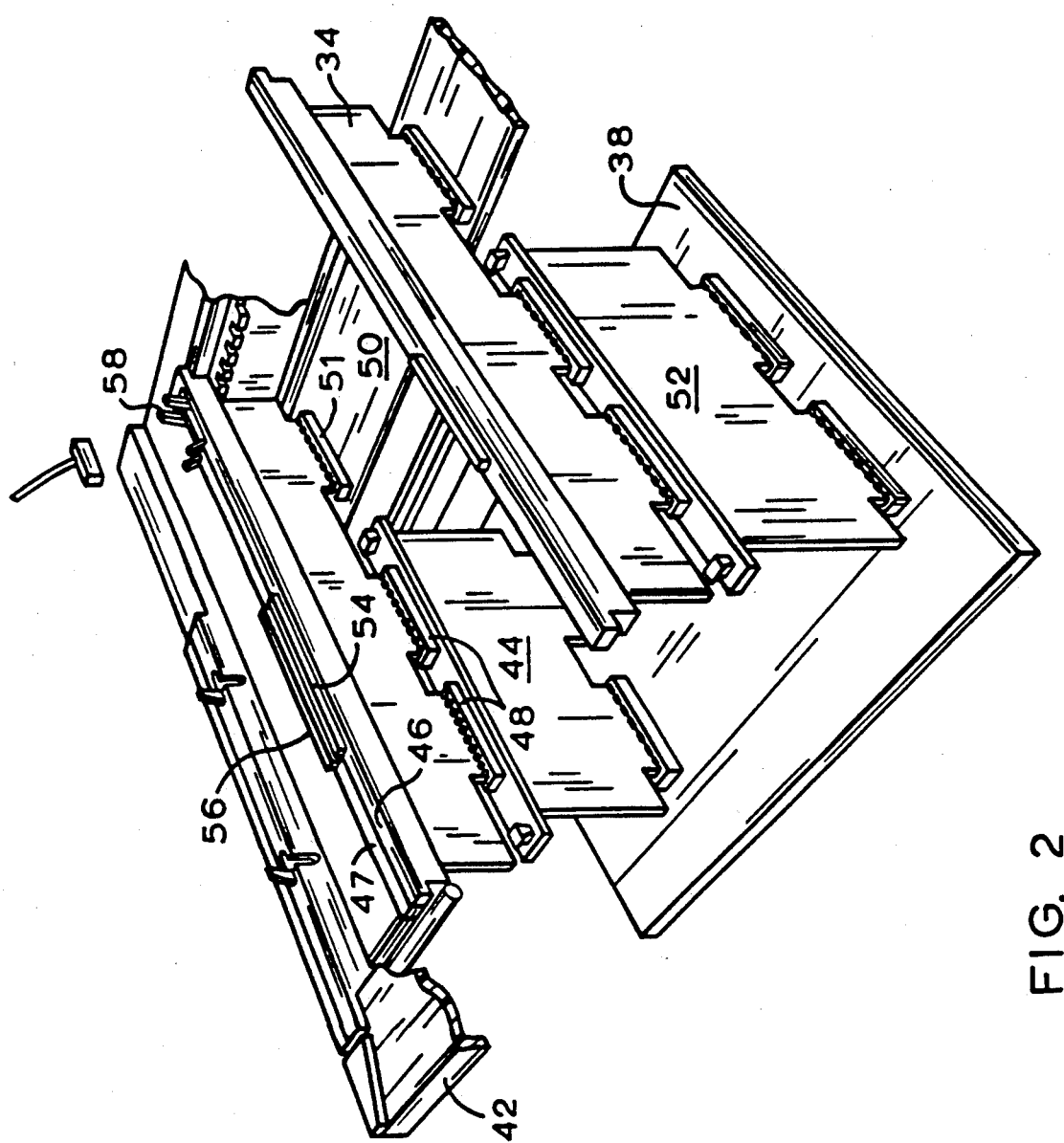
FIG. 2 is a perspective view, partially broken away, of some of the elements of that tester.

FIG. 2 shows the physical arrangement that certain of the elements of FIG. 1 might assume in an embodiment of the present invention. FIG. 2 shows that the VXI bus 38 is provided, in the conventional manner, as a backplane bus lying in a horizontal plane near the bottom of a tester chassis 42. The driver/sensors 14 and digital voltmeter 18 of FIG. 1 are provided by a number of circuit boards plugged into the VXI backplane 38 to receive the instrument-control signals that program and otherwise control their operation. FIG. 2 depicts only one of those boards 44, but a typical tester will employ many such boards arrayed physically in parallel. FIG. 2 omits the connectors into which such further boards would be plugged.

The circuit tester provides the scanner 20 in a plurality of circuit boards. Only two scanner boards 46 and 47 appear in FIG. 2, but the typical arrangement will employ a larger number. According to the present invention, the scanner 20 of FIG. 1 further includes a scanner backplane bus 50, which is separate from the VXI instrument bus 38. In the illustrative embodiment, the two buses are physically more or less parallel to each other. Scanner board 46 plugs into connectors 48 at the upper edge of board 44, where the board provides the ports at which the analog instrument or driver/sensors drive and/or sense signals. Scanner boards 46 and 47 also plug into connectors such as connector 51 on the scanner bus 50, from which they receive scanner-control signals. They also send and receive instrument and DUT signals over bus 50.

By using such a separate scanner bus, testers that employ the teachings of the present invention can provide the user with the advantage of an open architecture but avoid unwieldy wiring arrangements.

Although FIG. 2 shows edge connectors 48 as making the connection between boards 44 and 46, instrument boards not made by the tester manufacturer will not in general be arranged to mate in such a manner with the tester manufacturer's scanner boards. For this reason, the tester manufacturer preferably makes the height of its own instrument boards greater than the standard VXI-board height. This will leave a space between the scanner-board lower edge and the upper edges of the other suppliers' (standard-height) instrument boards, where, say, coaxial-cable connections can be made between the boards.

For further simplicity, FIG. 2 does not show the largely conventional connection of the VXI backplane 38 to the MXI bus by which the computer 28 communicates with the scanner 20. As was explained above, however, the computer does send signals to the VXI backplane 38, and some of those signals, appropriately decoded, are forwarded to the scanner 20 by the scanner driver 34, which is shown in FIG. 2 as being embodied in a circuit board oriented parallel to scanner boards 46 and 48. A "slot zero" board 52 makes the connections between the VXI backplane 38 and the scanner driver 34.

The upper edges of the scanner boards 46 and 47 provide connectors 54 and 56, which, together with corresponding connectors on other scanner boards not shown, contain part of the system pins 24 of FIG. 1. Also included on the upper edges of scanner boards 46 and 47 are connectors 58 for attaching coaxial cables from, for instance, the external waveform generator 16 of FIG. 1. (Of course, the waveform generator could be provided as the driver/sensors and the voltmeter are; i.e., it could be connected between a scanner board and the VXI bus.) It is through a discussion of the connection between the system pins and analog instruments such as the waveform generator 16 and the digital voltmeter 18 that the present invention will now be illustrated, although the broader principles of the invention can also be applied to connecting digital instruments.

Figure 3A:
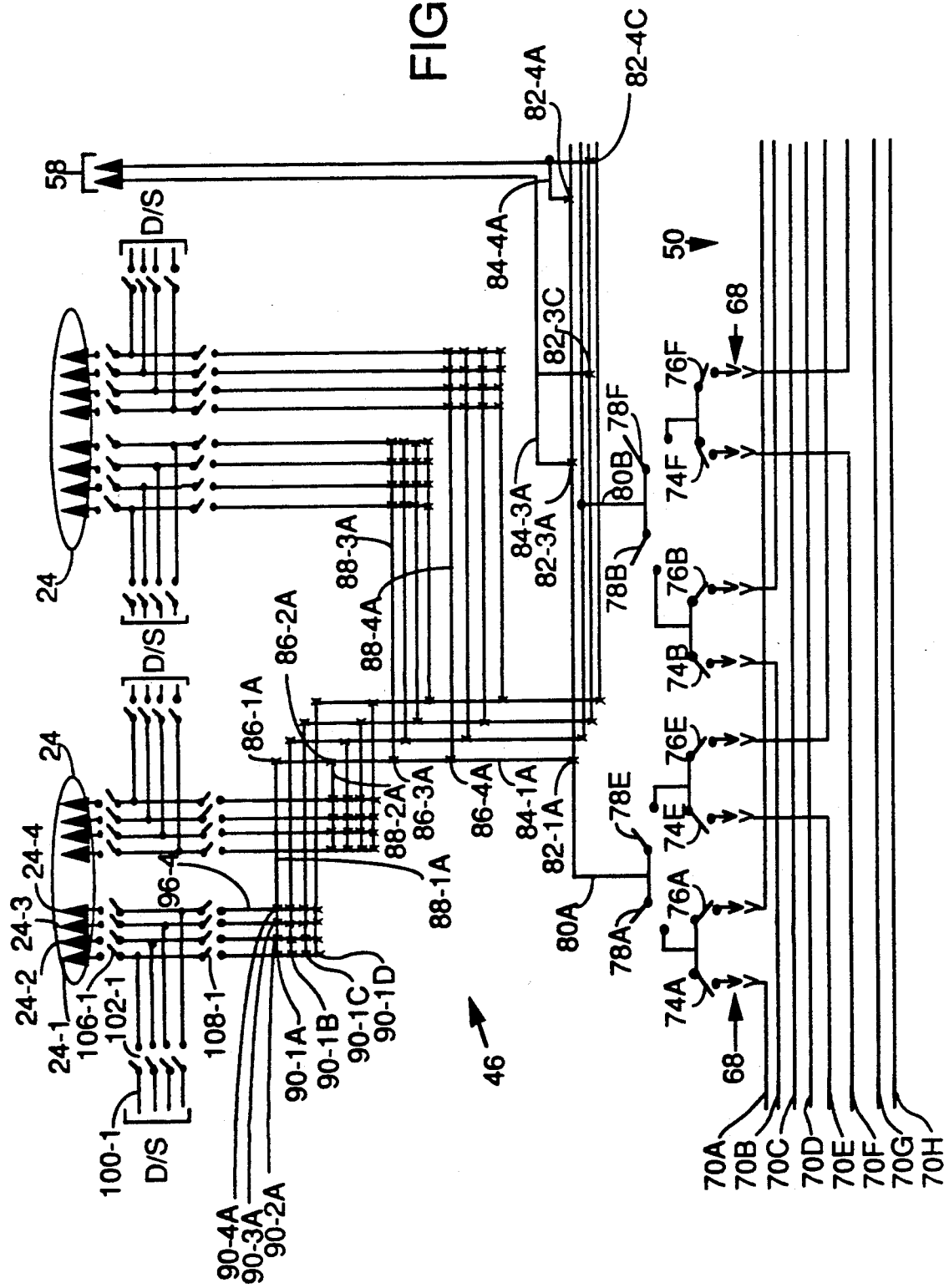
FIGS. 3A and 3B together comprise a schematic diagram of a part of the tester's scanner circuitry.
Figure 3B:
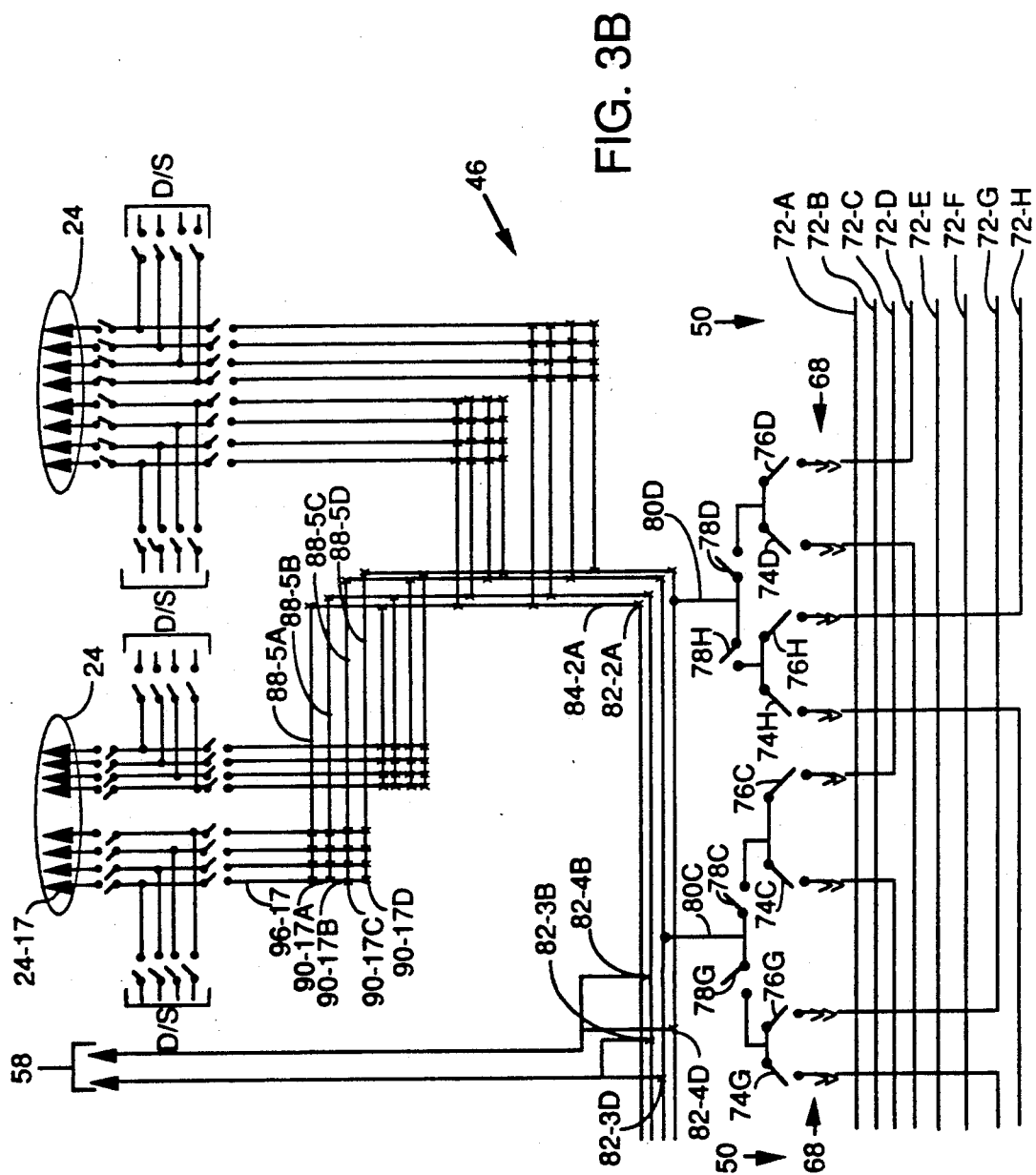

FIGS. 3A and 3B depict in schematic form part of the switching functions performed by scanner board 46. The sixteen pairs of contacts 68 arrayed along the lower portions of FIGS. 3A and 3B represent contacts on the mating connectors 51 (FIG. 2) by which scanner board 46 is connected to eight pairs of conduction-path links in eight respective sequences of many links on the scanner backplane 50. (The scanner backplane 50 also carries scanner-control signals on lines not shown in FIGS. 3A and 3B.) Each sequence forms a conduction path that runs the length of the scanner bus 50 when its component links are connected in series by switches on the various scanner boards, as will be explained presently. A first set of conductor links 70A-H (FIG. 3A) extends to connector 51 from the next connector to the left on the scanner backplane 50. A second set of links 72A-H (FIG. 3B) extends to connector 51 from the next connector to the right.

The purpose of these sequences of links is to carry signals between system pins 24 on one scanner board and analog instruments accessed through another scanner board. The manner in which this is accomplished involves the operation of switches 74A-H, 76A-H, and 78A-H, whose operation will now be described, as well as of certain other switches, whose operations will be described later.

Suppose that a waveform generator connected to a scanner board disposed to the left of the scanner board 46 depicted in FIGS. 3A and 3B has placed a signal on conductor link 70A in a manner to be described below. Suppose further that this signal is to be forwarded to one of the system pins 24 on the scanner board depicted in FIGS. 3A and 3B. This result is achieved by operating first-link and second-link switches 74A and 76A and internal switch 78A, all of which are associated with the link sequence of which link 70A is a part (the "A sequence"). Specifically, switches 74A and 78A are closed, while switch 76A remains open. Also open is the internal switch 78E associated with the E sequence. The result of these switch states is that the signal from link 70A is steered to the upper circuitry in FIGS. 3A and 3B and is not forwarded to the next link 72A in the A sequence.

We now change the assumption so that the waveform-generator signal is coming from a source to the right rather than from one to the left but is still intended for one of the system pins 24 on the board represented by FIGS. 3A and 3B. To achieve this result, the states of internal switches 78A and 78E remain the same, but those of first- and second-link switches 74A and 76A are reversed. The switches thereby steer the signal from link 72A to the upper circuitry and isolate link 70A from the upper circuitry as well as from link 72A.

Now suppose that the signal originates in a waveform generator connected to a scanner board to the right of the board in FIGS. 3A and 3B and that its destination is a scanner board to the left of that in FIGS. 3A and 3B; that is, the signal is not intended to be directed to any of the system pins 24 on board 26 of FIGS. 3A and 3B. To achieve this result, internal switch 78A is opened, and the first-link and second-link switches 74A and 76A are both closed so as to connect first link 70A to second link 72A. That is, the board illustrated in FIGS. 3A and 3B acts to provide continuity in the otherwise interrupted A sequence, which includes links 70A and 72A.

Finally, suppose that a waveform-generator signal comes from the upper circuitry in FIGS. 3A and 3B in a manner that will be described later. Suppose further that this signal is to be forwarded to a system pin 24 on a scanner board to the left of that depicted in FIGS. 3A and 3B. Furthermore, assume that the signal is to be sent to the left along the A sequence of links, i.e., along link 70A. To achieve this result, internal switch 78E is open, internal switch 78A is closed, first-link switch 74A is closed, and second-link switch 76A is open.

The result of this transmission scheme is that it automatically adjusts the length of the signal path so as to minimize stub lengths. Specifically, when signals are to be transmitted from one scanner board to another, only the scanner-bus links disposed between those two boards are connected; the other scanner-bus links are isolated from those links, so the reflections that would otherwise result are avoided despite the common-path feature that results from a bus organization.

We now turn to the matrix organization depicted in the upper portions of FIGS. 3A and 3B. These matrices represent four parallel tree structures. Each tree structure has a respective one of four "trunk" conductors 80A-D at its lowest level. Conductor 80A, the trunk of the first tree, is associated with the A and E sequences of links. Similarly, conductor 80B is associated with the B and F sequences, conductor 80C with the C and G sequences, and conductor 80D with the D and H sequences.

By means of tree switches 82-1A, 82-2A, 82-3A, and 82-4A, trunk conductor 80A at the lowest level of the A tree fans out to four "limb" conductors 84-1A, 84-2A, 84-3A, and 84-4A at the next higher level. Limb conductors 84-3A and 84-4A lead directly to coaxial-cable connectors 58, while connectors 84-1A and 84-2A both fan out further. By means of tree switches 86-1A, 86-2A, 86-3A, and 86-4A, for instance, limb conductor 84-1A fans out to four "branch" conductors 88-1A, 88-2A, 88-3A, and 88-4A. Each of these branch conductors, in turn, fans out to four respective system pins 24. By means of tree switches 90-1A, 90-2A, 90-3A, and 90-4A, for instance, conductor 88-1A fans out to four respective system pins 24-1, 24-2, 24-3, and 24-4.

By means of these and similar limbs and branches, trunk conductor 80A can be connected to any of the system pins 24 through a proper selection of switch closures. Since trunk conductor 80A can in turn be connected to left link 70A or 70E or to right link 72A or 72E, signals on the A and E sequences can be steered to any of the system pins 24. Inspection of FIGS. 3A and 3B reveals that each of the other trunk conductors 80B, 80C, and 80D can similarly be connected through a respective parallel tree to any of the system pins 24, so the system pins can additionally be connected to the link sequences associated with those trunk conductors.

The trunk conductors 80 can be connected selectively not only to the system pins but also to the analog instruments to which the scanner is connected.

Switches such as switch 82-3A can connect a trunk conductor to a limb conductor such as conductor 84-3A, which leads to an analog instrument. If board 44 is an analog-instrument board, conductor 84-3A leads to the lower-edge contact pads that the instrument-board connector 48 (FIG. 2) receives. In order to show the range of features that a scanner board might have, however, FIG. 3A includes driver-sensor signal paths, which a scanner board of the type connected to a driver/sensor board would include. Such a scanner board would have its analog-instrument paths such as conductor 84-3A connected to the upper-edge connector 58, so FIG. 3A shows such a connection.

With a plurality of scanner boards plugged into it, the scanner bus can provide connections to as many as eight different instruments, although the system pins 24 on a single scanner board can be connected to only four of them at the same time. This means that, from the point of view of, say, system pin 24-17 (FIG. 3B), conductors 88-5A, 88-5B, 88-5C, and 88-5D represent the beginnings of paths that the tester provides to separate instruments on other boards when proper connections are made. Accordingly, by means of matrix switches 90-17A, 90-17B, 90-17C, and 90-17D, the DUT conductor path 96-17 associated with system pin 24-17 can be connected to any one of four instrument conduction paths that begin with respective branch conductors 88-5A, 88-5B, 88-5C, and 88-5D.

As was mentioned above, FIGS. 3A and 3B include the signal paths and other circuitry that would be provided by a scanner board of the type intended for connection to a driver/sensor board, which contains a group of digital instruments, i.e., driver/sensors. On such a scanner board, each of the system pins 24 is connectable not only to the analog instruments to which connector 58 and the scanner bus 50 provide connection but also to a respective dedicated driver/sensor on board 44. (Although the multiplexing approach illustrated here for analog instruments is also applicable to digital instruments, the illustrated embodiment does not multiplex the digital instruments, because it is intended for applications in which little hardware savings would result from doing so.) For instance, closure of a switch 102-1 connects system pin 24-1 to a conductor 100-1 that leads to a driver/sensor on board 44. Additionally, an overvoltage-protection circuit, provided on board 46 but not shown in the drawings, can be connected to system pin 24-1 by operation of a switch not shown in FIG. 3A but designated switch 104-1 in FIG. 6. Moreover, to isolate unused DUT test points and minimize stub lengths when these various options are employed, the board provides further switches 106-1 and 108-1.

For each of the thirty-two system pins 24, therefore, the scanner board 46 must provide eight switches: a driver/sensor switch such as switch 102-1, an overvoltage-protector switch such as switch 104-1 (FIG. 6), two isolation switches such as switches 106-1 and 108-1, and four matrix/tree switches such as switches 90-1A, 90-1B, 90-1C, and 90-1D. These are required in addition to the lower-level tree switches and the switches for selecting the mode of connection to the scanner bus 50.

The scanner provides this large number of switches as mechanical relays, which, because of their size, can present layout and stub-length problems. A structure of the type depicted in FIG. 4 reduces both the layout and the stub-length problems by extending the layout into a third dimension. The resulting arrangement simplifies the layout problem so as to enable the designer to provide more channels than an equivalent-sized two-dimensional layout would permit, and it reduces to a fraction the stub length required to provide the flexible layout illustrated in FIGS. 3A and 3B.

Figure 4:
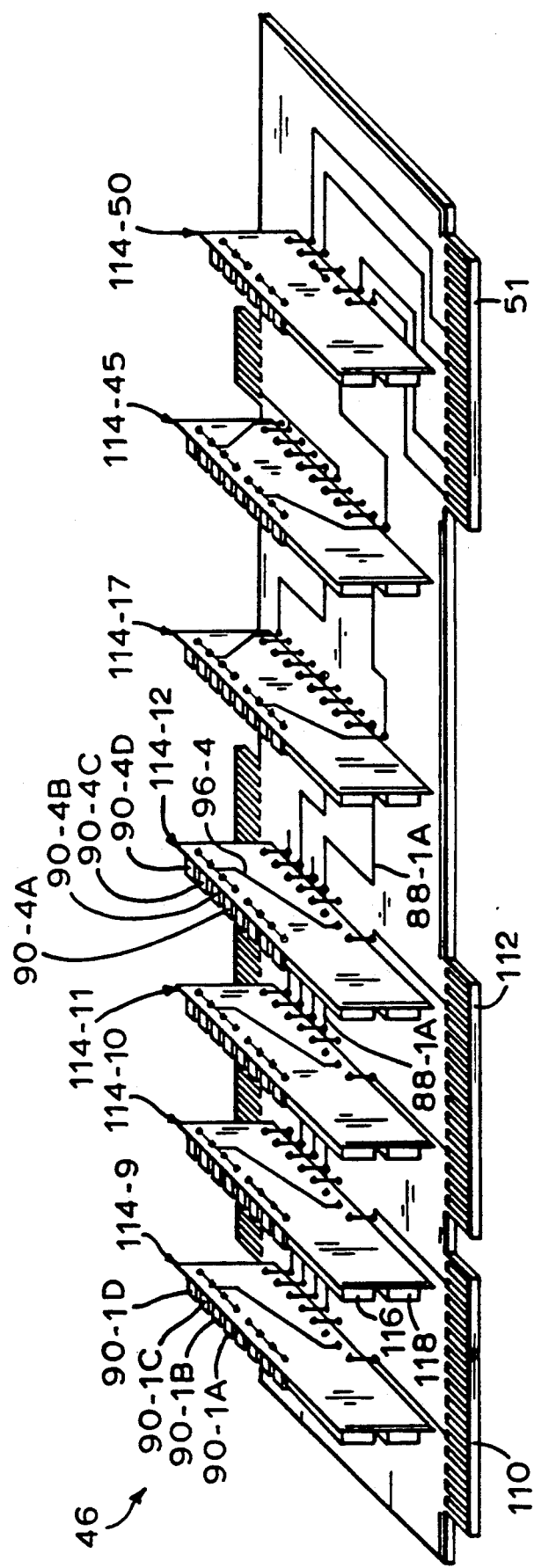
FIG. 4 is an isometric view of one of the scanner boards, showing auxiliary boards mounted on it.

FIG. 4 depicts representative parts of scanner board 46, showing two connectors 110 and 112 by which it plugs into the driver/sensor board 44. FIG. 4 also depicts the connector 51 by which board 46 plugs into the scanner bus 50. The various layers of (multi-layer) board 46 provide many of the conduction paths depicted in FIGS. 3A and 3B.

However, the switches, which are all provided as mechanical relays, are mounted on auxiliary boards 114, which in turn are mounted on the main board 46 and extend transversely from its surface. There are fifty auxiliary boards, labeled 114-1 through 114-50, of which FIG. 4 shows only seven. Boards 114-1 through 114-46 contain eight relays apiece. Boards 114-47 through 114-50 contain six apiece.

Each board also contains circuitry, such as integrated circuits 116 and 118 on board 114-10, for controlling the relays on that auxiliary board. Circuitry provided on the main board 46 but not shown in the drawings receives instructions coupled to it by means of connector 51 from the scanner bus 50, which in turn receives those signals from the computer 28 by way of the scanner driver 34 (FIG. 2), the "slot zero" board 52 (FIG. 2), and buses 36 and 38 (FIG. 1). This circuitry receives signals from the computer 28 that designate the states that the relays are to assume, and it drives the relays so that they assume the proper states.

Figure 5:
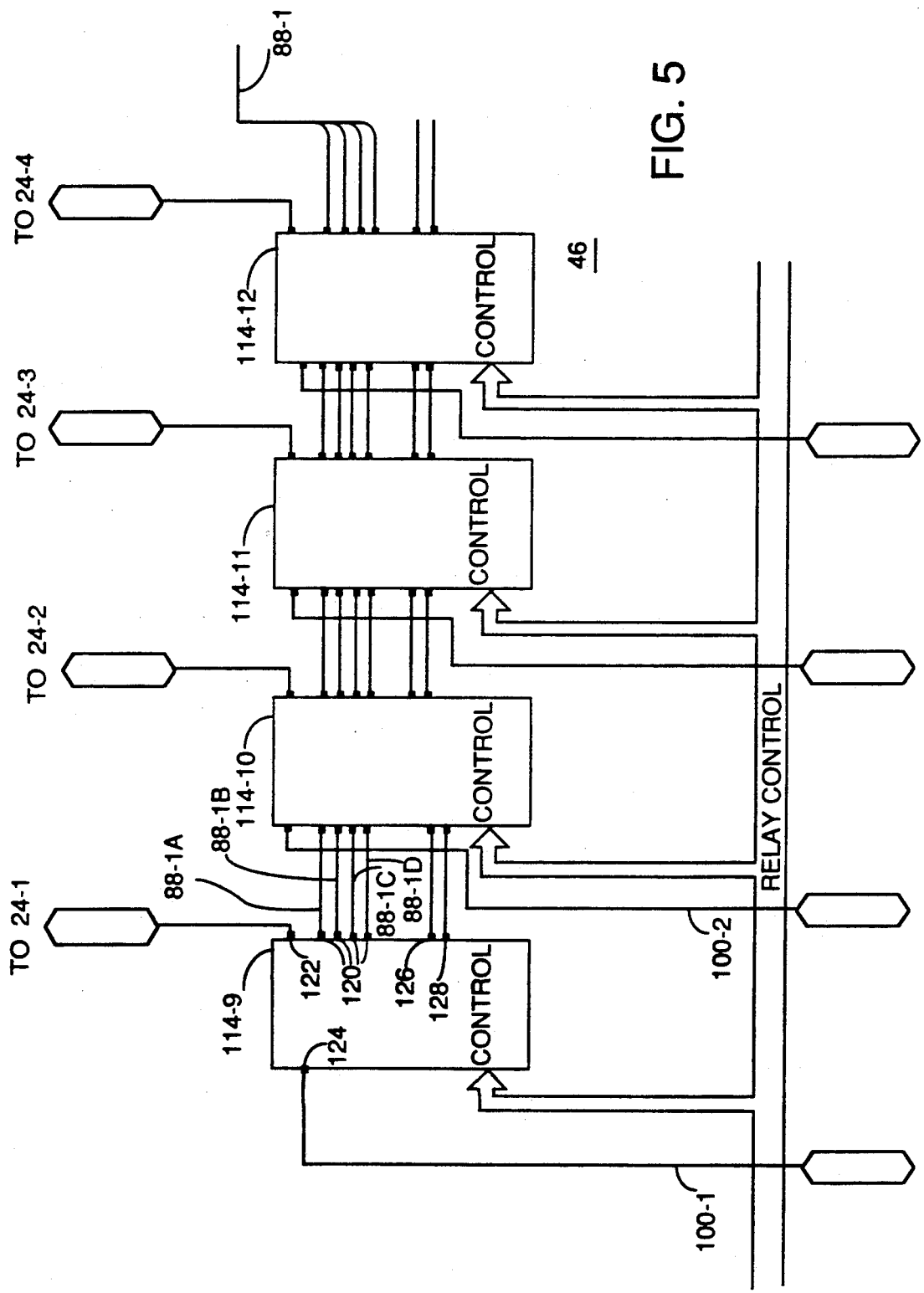
FIG. 5 is a schematic diagram of the interconnections among certain of the auxiliary boards on a main scanner board.

The first eight auxiliary boards 114 provide functions not germane to the present discussion and not represented in FIGS. 3A and 3B. FIG. 5 shows the interconnection of the next four boards 114-9, 114-10, 114-11, and 114-12, which contain the sixteen relays 90-1A through 90-1D, 90-2A through 90-2D, 90-3A through 90-3D, and 90-4A through 90-4D that interconnect system pins 24-1, 24-2, 24-3, and 24-4 with branch conductors 88-1A through 88-1D. As FIG. 5 shows, the main board contains branch conductive paths 88-1A, 88-1B, 88-1C, and 88-1D, to which corresponding terminals in each of auxiliary boards 114-9 through 114-12 are connected.

Figure 6:
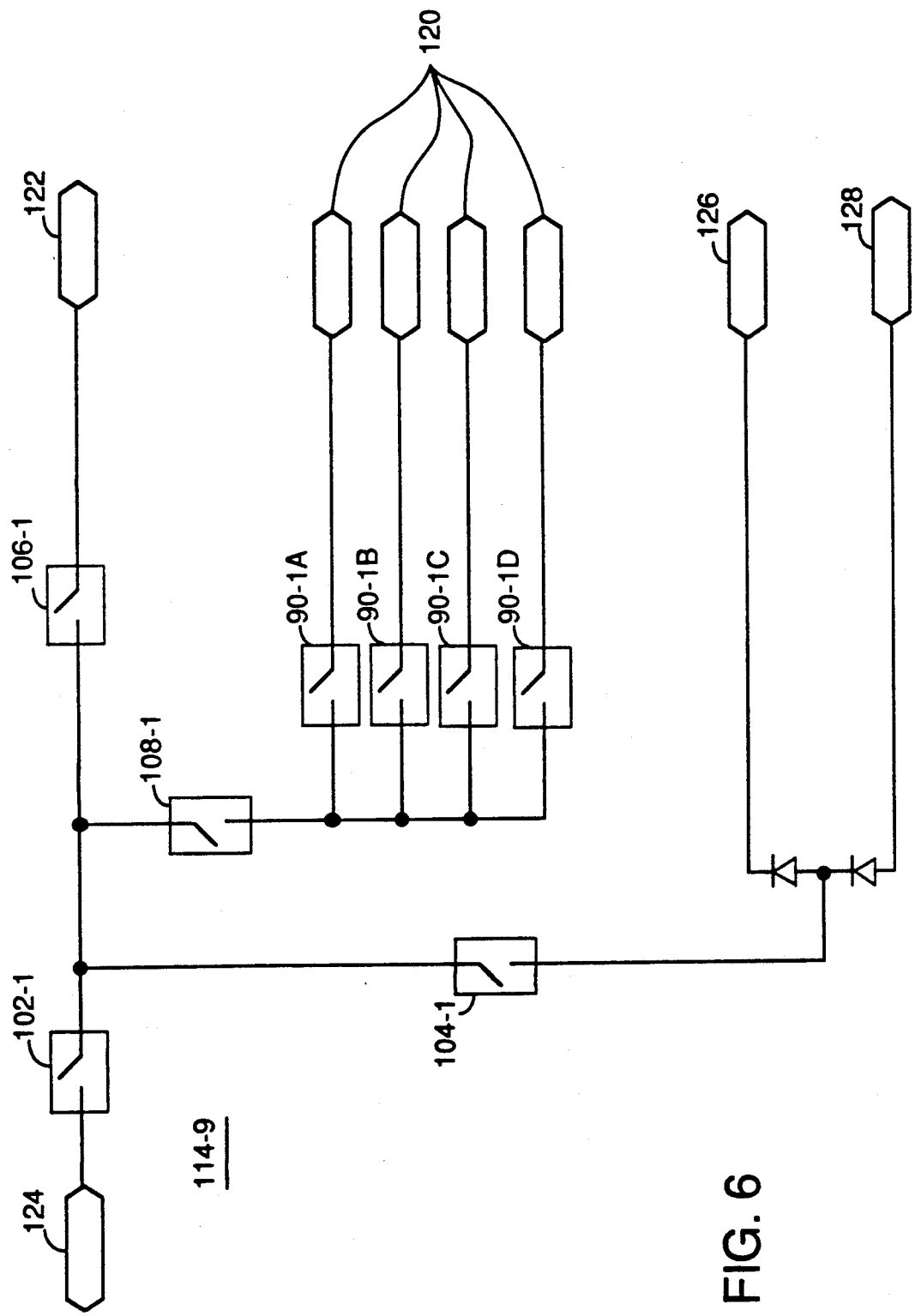
FIG. 6 is a schematic diagram of the interconnection of the relays included on auxiliary boards of the type depicted in FIG. 5.

FIG. 6, which is a schematic diagram of the switching connections on board 114-9, depicts these terminals 120 on board 114-9 and shows that they lead to the matrix switches 90-1A, 90-1B, 90-1C, and 90-1D, which auxiliary board 114-9 provides. Another terminal 122 connects isolation relay 106-1 to system pin 24-1 by way of the main board, while yet another terminal 124 connects relay 102-1 to driver/sensor pin 100-1 by way of the main board. Further terminals 126 and 128 provide the connections between the auxiliary board 114-9 and the overvoltage-protection circuitry on the main board 46.

For the sake of clarity, FIG. 6 omits the relay-driver and other control connections needed to interpret and retain instructions regarding the required relay states. Raising these connections, as well as the connections illustrated in FIG. 6, out of the plane of the main board 46 greatly simplifies the conduction-path layout and, as will be explained later in greater detail, reduces the stub lengths required to achieve circuit versatility.

Figure 7:
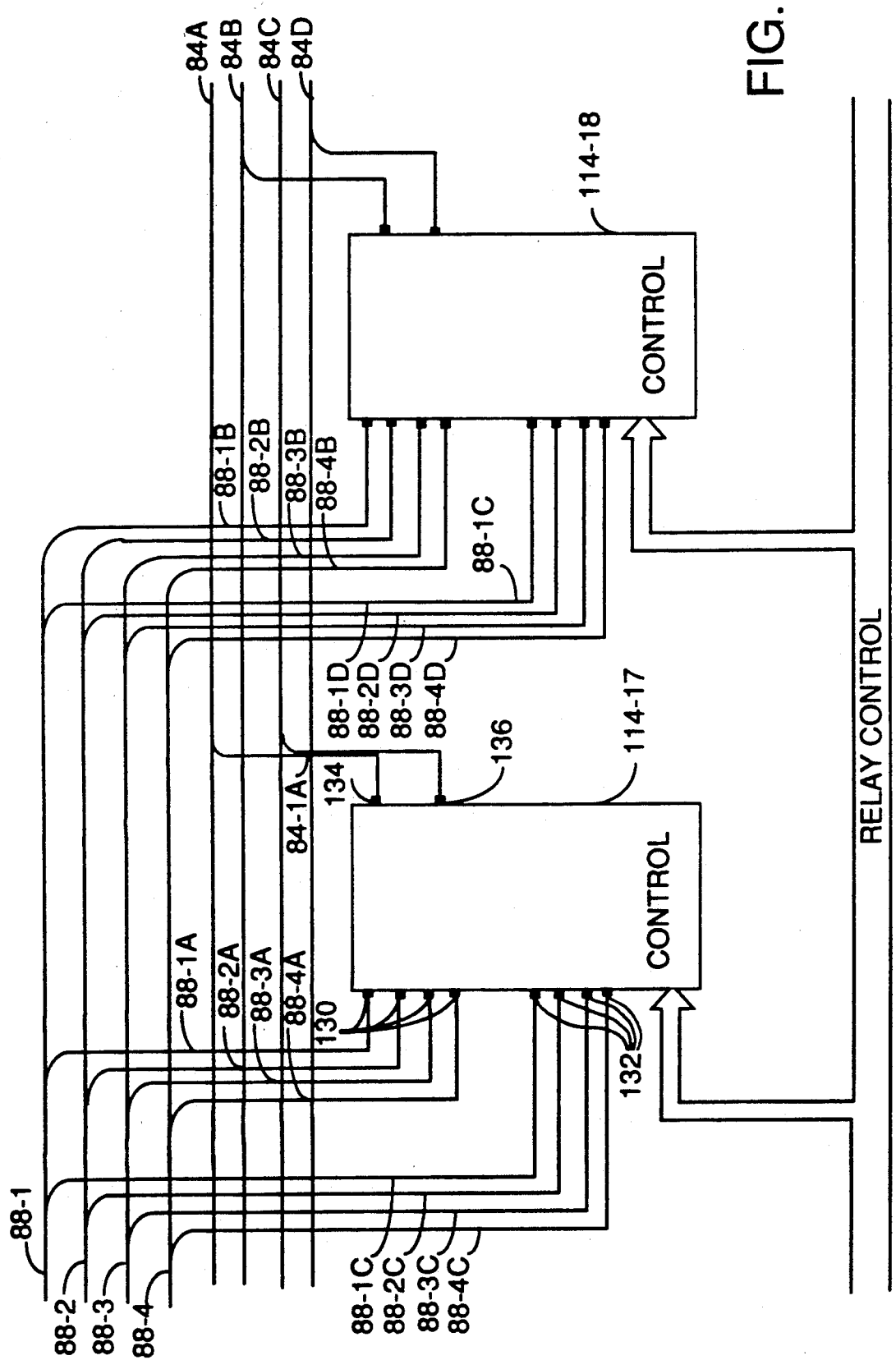
FIG. 7 is a schematic diagram of the interconnections among others of the auxiliary boards on the scanner board of FIG. 4.

We now return to FIG. 5. Auxiliary boards 114-10, 114-11, and 114-12 are identical to board 114-9; each provides the switching necessary to connect its associated system pin 24 to one of the trees through their respective branch conductors 88-1A, 88-1B, 88-1C, and 88-1D, each of which fans out into four system pins. To provide connections for all thirty-two system pins, the circuitry of FIG. 5 is replicated eight times (4×8=32). The outputs of these groups of switches are eight four-conductor groups such as group 88-1 of FIG. 5, each of which contains four corresponding branch conductors, one for each of the four trees. FIG. 7 shows four of these four-conductor groups 88-1, 88-2, 88-3, and 88-4 leading to two auxiliary boards 114-17 and 114-18. The other four four-conductor groups lead in an identical manner to the thirty-fifth and thirty-sixth auxiliary boards 114, which are not shown in the drawings. These four boards contain the relays 86 that provide the concentration from the branch conductors 88 to the limb conductors 84.

Figure 8:
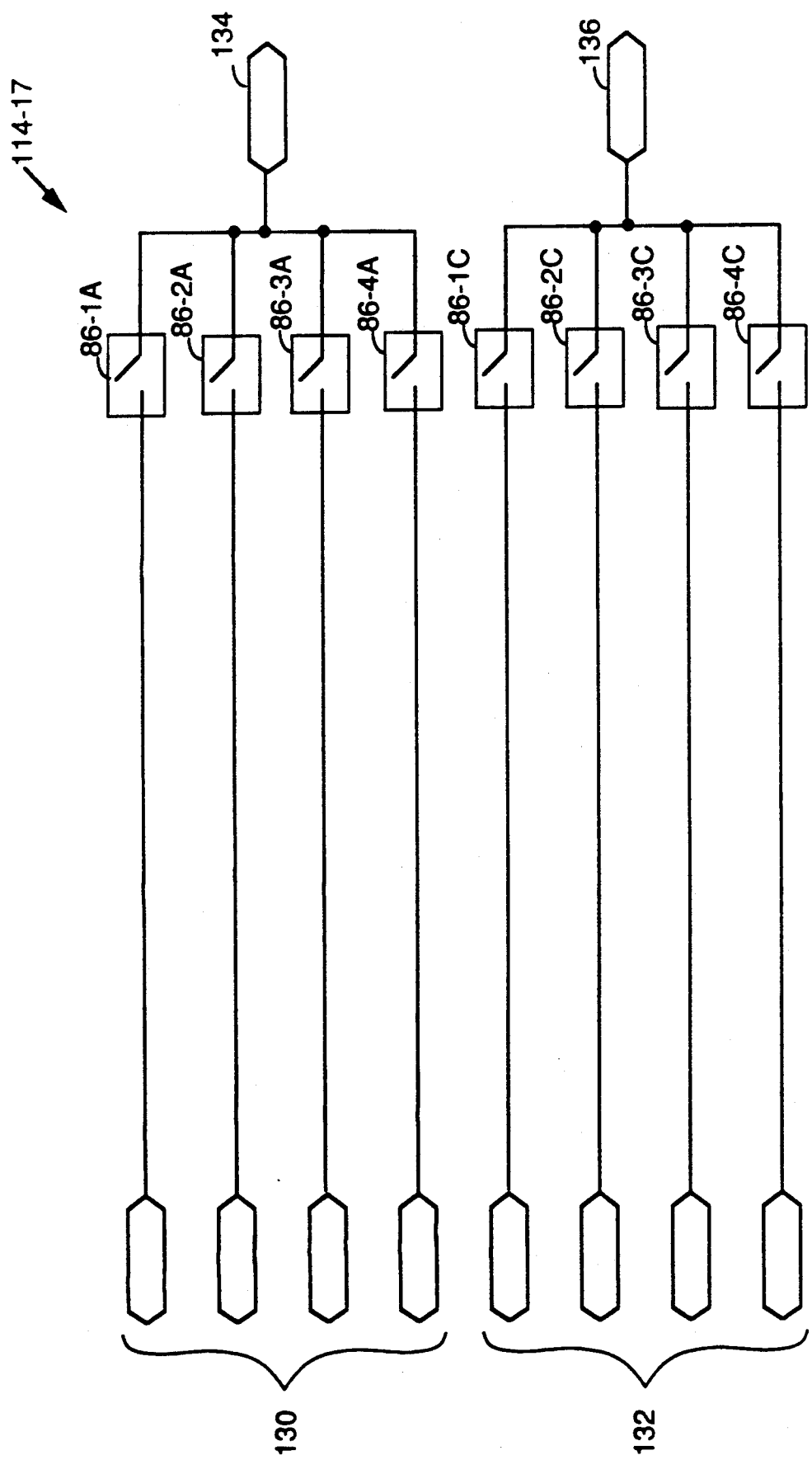
FIG. 8 is a schematic diagram of the interconnection of the relays on an auxiliary board of the type depicted in FIG. 7.

FIG. 8 is a schematic diagram of the internal switch arrangement of auxiliary board 114-17. Terminals 130 of auxiliary board 114-17 receive the A-tree conductors from the four branch-conductor groups that lead to boards 114-17 and 114-18, while terminals 132 of that board receive the C-tree conductors from those groups. Corresponding terminals on board 114-18 receive the B-tree and D-tree conductors, respectively, from those groups. The identical pair of auxiliary boards that receives the other four branch-conductor groups segregates the A, B, C, and D conductors similarly.

Board 114-17 concentrates its eight branches into two limbs in a manner that is apparent from its schematic diagram in FIG. 8, which identifies its relays in accordance with the numbering scheme followed in FIGS. 3A and 3B.

Figure 9:
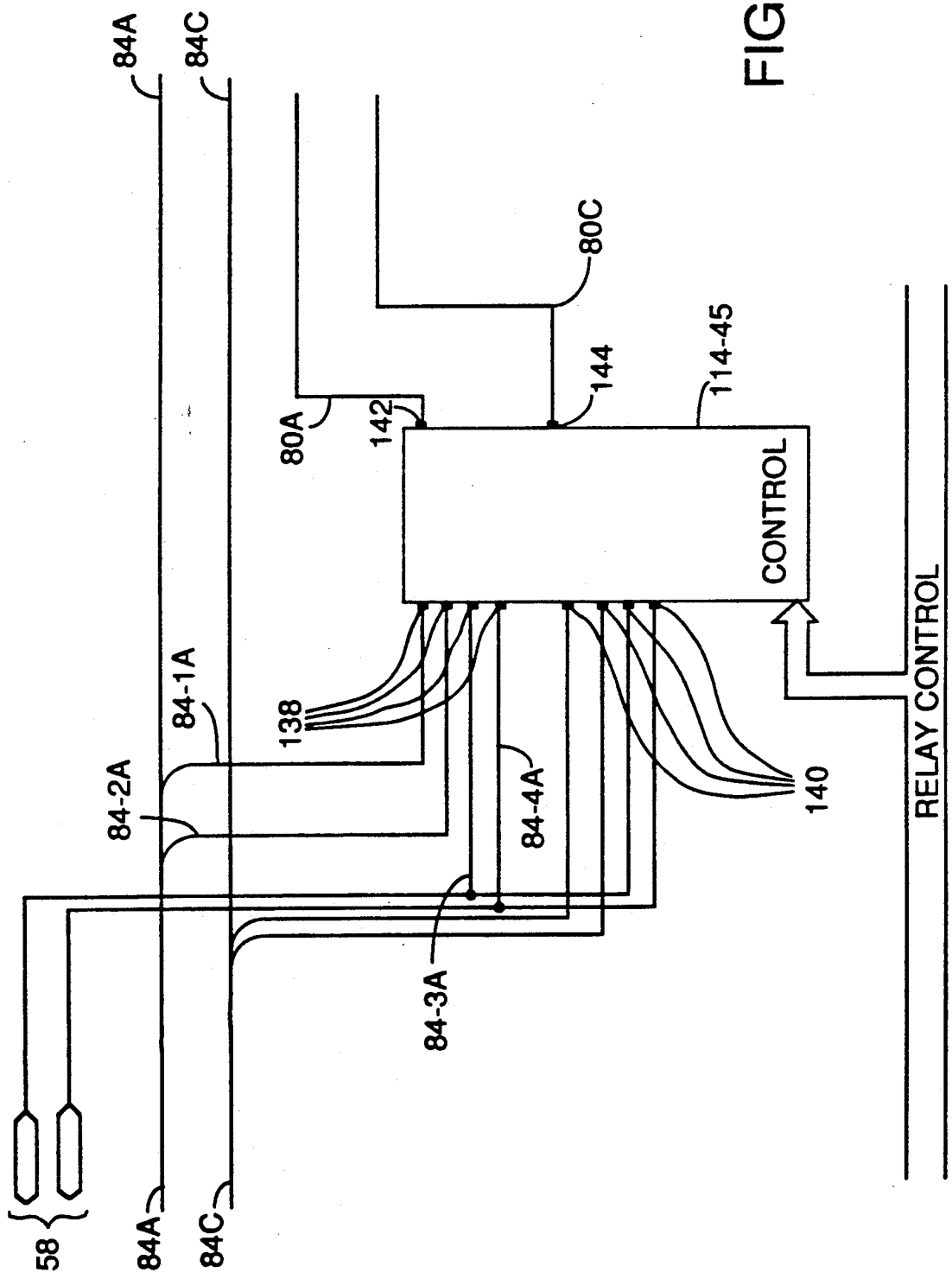
FIG. 9 is a schematic diagram of the connections to another of the auxiliary boards mounted on the scanner board of FIG. 4.
Figure 10:
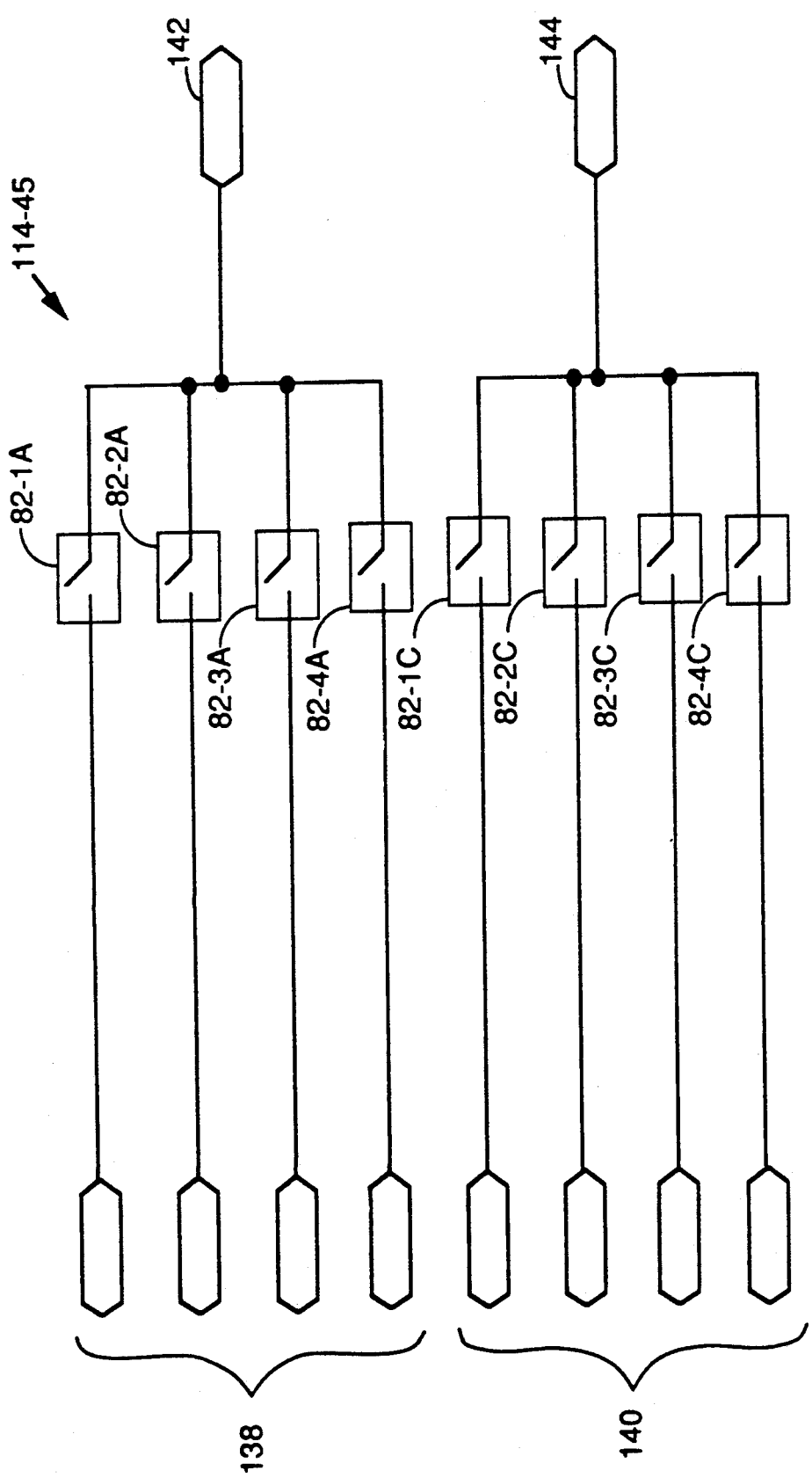
FIG. 10 is a schematic diagram of the interconnection of the relays on the auxiliary board of FIG. 9.

FIG. 9 depicts auxiliary board 114-45, whose terminals 138 are connected to the limb conductor 84-1A from terminal 134 (FIG. 8) of auxiliary board 114-17, limb conductor 84-2A from the corresponding terminal on the thirty-fifth auxiliary board, and two lines 84-3A and 84-4A from two of the coaxialcable connectors 58. Board 114-45 provides the concentration of all of the A-tree limb conductors into the A-tree trunk conductor 80A. Board 114-45 also receives all of the C-tree limb conductors at its terminals 140 and provides the concentration into the C-tree trunk conductor 80C. Board 114-45 is identical internally to the board 114-17 depicted in FIG. 8, but FIG. 10 depicts its internal connections schematically in order to show the correspondence of its relays to those depicted in FIGS. 3A and 3B.

The forty-sixth auxiliary board, not shown in the drawings, performs a similar concentration function for the B and D trees.

Figure 11:
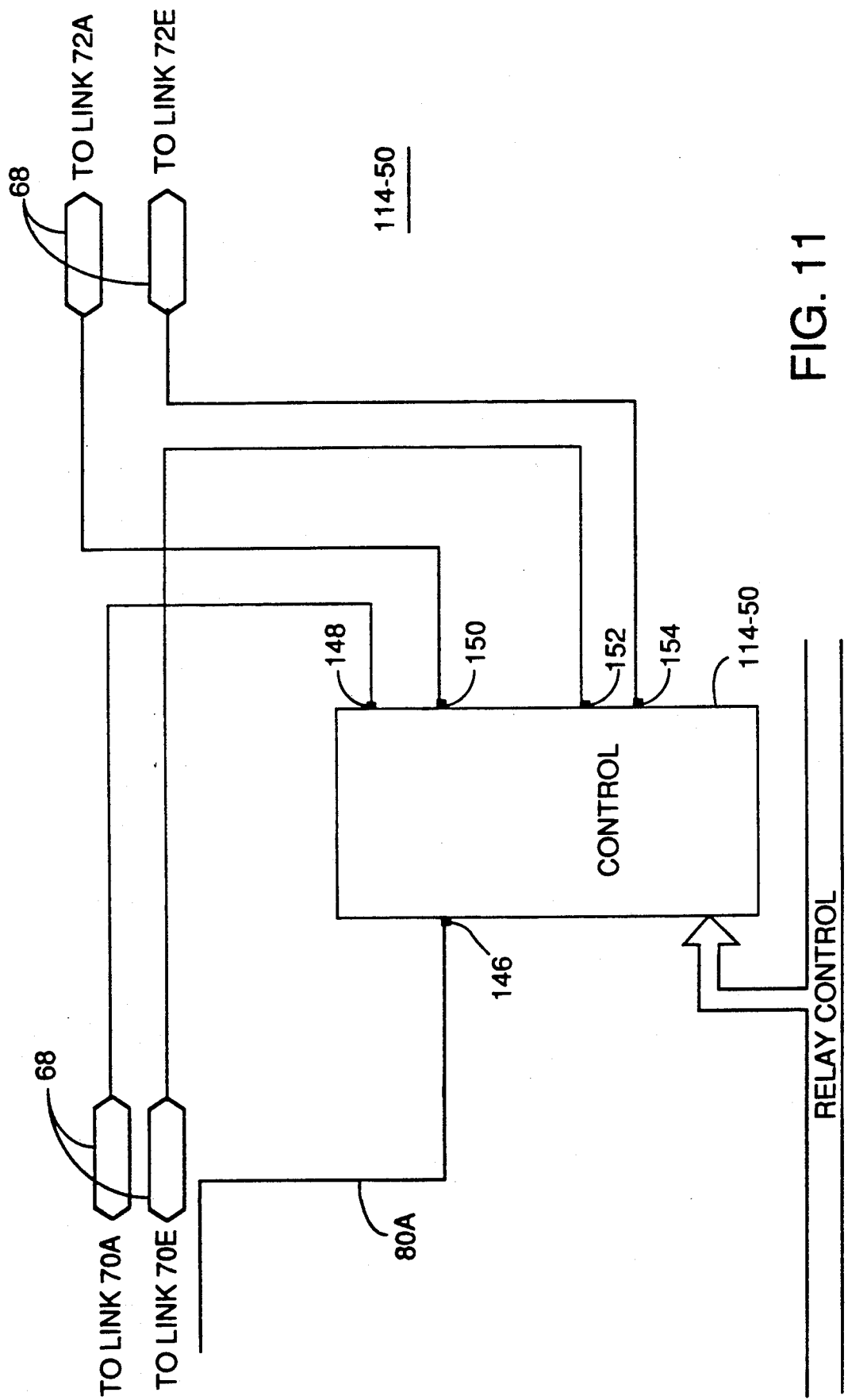
FIG. 11 is a schematic diagram of the interconnections among further auxiliary boards mounted on the scanner board of FIG. 4.

As FIGS. 3A and 3B show, each of the "trunk" conductors 80A-D can be connected selectively to two links in each of two respective link sequences. A separate auxiliary card for each tree provides the relays that perform this switching. FIGS. 11 and 12 depict one of those auxiliary boards 114-50, whose relays perform this switching for the A tree. Board 114-50 is internally identical to the forty-seventh, forty-eighth, and forty-ninth boards, which perform the same functions for the D, C, and B trees, respectively. As FIG. 11 shows, a common terminal 146 is connected to the trunk conductor 80A of the A tree. FIG. 12 shows the connections to the relays internal to board 114-50, showing that it contains relays 74A and E, 76A and E, and 78A and E, whose functions have been described above in connection with FIG. 3A. An auxiliary-board terminal 148 provides the connection from relay 74A to the conductor path on the main board that leads to the main-board terminal 68 by which the main board is connected to link 70A. In a similar manner, terminals 150, 152, and 154 provide the connections to links 72A, 70E, and 72E, respectively.

By returning to FIGS. 3A and 4, one can appreciate the particular advantages of the three-dimensional switch organization. As FIG. 3A shows, the sixteen relays 90-1A through 90-1D, 90-2A through 90-2D, 90-3A through 90-3D, and 90-4A through 90-4D form a cross-point matrix of switches that perform what can be thought of as a reciprocal treeing operation: not only can a branch 88-1 of a given tree be connected to any one of four system pins 24-1 through 24-4, but any of those system pins can also be connected to top branch 88-1 of any of the four trees.

Each of these selections results in transmission stubs; that is, although a main path is formed through the closed switch, a stub path branches from the main path to the open switches. It is important to keep these stub lengths short enough that the round-trip propagation time through them is short in comparison with the rise times of the signals that the system is intended to handle.

To understand the stub problem that the cross-point matrices present, suppose that the relays are to be set so that system pin 24-4 is to be connected into the A tree. This means that relay 90-4A will be closed, while relays 90-4B, 90-4C, and 90-4D will be open. A stub will accordingly be present on conductor 96-4, which, as FIG. 4 shows, is T-shaped. Specifically, the signal path that includes conductor 96-4 appears at the bottom of board 114-12 and forks when it reaches the top of that board. The signal is intended to proceed to the left to one side of relay 90-4A, which directs it to branch conductor 88-1A. However, the signal also propagates to the right until it reaches the open relay 90-4D, which reflects it. It is this distance, i.e., the distance from the fork to the open relay and back, that must be kept below a minimum dictated by the shortest signal rise time that the system is required to handle. Because the elongated relays are longitudinally disposed in parallel, conductor 96-4 can fan out to four relays without making this stub length excessive.

This same result could be achieved, of course, by arraying those relays on the main board 46 rather than on the auxiliary board 114-9. Because of the reciprocal nature of the treeing, however, stubs occur not only on the pin conductor 96-4 that spans corresponding branch conductors of the four trees but also on the branch conductor 88-1A that spans the four pin conductors, which are provided on different respective auxiliary boards 114-9 through 114-12.

Specifically, although the signal received from system pin 24-4 (FIG. 3A) is intended to propagate from the bottom of relay 90-4A on board 114-12 to the right along conductor 88-1A to board 114-17, it also propagates to the left along conductor 88-1A until it reaches open relay 90-1A on auxiliary board 114-9, from which it reflects back to the right. It is important for this reflection time to be short, and it therefore is also important for the stub length determined by the distance between the corresponding ends of relays 90-1A and 90-4A to be short. It would be virtually impossible to accomplish this goal and keep the stub on branch conductor 88-1A short, too, in a two-dimensional layout. In a three-dimensional layout, however, the stubs on both conductors can be kept short simultaneously by placing auxiliary boards 114-9 through 114-12 on their edges, physically in parallel, and relatively close together. A three-dimensional layout thus yields a higher packaging density and hence shorter signal stubs.

By employing the teachings of the present invention, therefore, one can provide the advantages of an open architecture and still avoid unwieldy wiring. The present invention thus constitutes a significant advance in the art.

We claim:

1. An automatic circuit tester comprising:
    A) tester control circuitry for generating instrument- and scanner-control signals for controlling the states of instruments and scanners, respectively;
    B) a fixture, adapted for connection of system pins thereto and for reception of a device under test thereon, for coupling the system pins to predetermined test points on the device under test;
    C) a common backplane instrument bus connected to receive the instrument-control signals and including control conduction paths for conducting the instrument-control signals therealong;
    D) a plurality of instrument boards, each of which contains an electronic instrument controllable by instrument-control signals introduced at one, control edge of the instrument board and providing at another, scanner edge of the instrument board an instrument port at which the instrument board is connected at the control edge thereof to the instrument bus to receive the instrument-control signals therefrom for control of its respective instrument;
    E) a plurality of scanner boards, each of which provides system pins on a fixture edge thereof connected to the fixture and further provides at least one instrument port on a separate instrument edge thereof connected to the scanner edge of a respective one of the instrument boards for electrical communication between the instrument ports of the scanner board and its respective instrument board, each scanner board further containing scanner switches connected selectively to perform coupling and uncoupling between the instrument ports and the system pins, each scanner board further containing switch-control circuits for controlling the states of the scanner switches in response to scanner-control signals applied thereto; and
    F) a separate scanner backplane bus into which each scanner board is connected for application of the scanner-control signals to the switch-control circuits thereon.

2. An automatic circuit tester as defined in claim 1 wherein:
    A) the scanner bus additionally includes signal conduction paths, separate from the control conduction paths, for conducting instrument signals therealong;
    B) at least one of the scanner boards includes a switch thereon so connected as selectively to couple and uncouple an instrument port thereof to and from a signal conduction path on the scanner bus; and
    C) at least one other scanner board includes a switch thereon so connected as selectively to couple and uncouple a system pin thereof to and from the signal conduction path on the scanner bus,
    whereby an instrument connected to the one scanner board can be coupled to a system pin on the other scanner board.

3. An automatic circuit tester comprising:
    A) tester control circuitry for generating instrument-control signals for controlling the states of instruments;
    B) a fixture, adapted for connection of system pins thereto and for reception of a device under test thereon, for coupling the system pins to predetermined test points on the device under test;
    C) a common backplane instrument bus connected to receive the instrument-control signals and including control conduction paths for conducting the instrument-control signals therealong;
    D) a plurality of instrument boards, each of which contains an electronic instrument controllable by instrument-control signals introduced at one, control edge of the instrument board and providing at another, scanner edge of the instrument board an instrument port at which the instrument drives and/or senses signals under control of the instrument-control signals, each instrument board being connected at the control edge thereof to the instrument bus to receive the instrument-control signals therefrom for control of its respective instrument;
    E) a separate scanner backplane bus providing signal conduction paths for conducting instrument signals therealong; and
    F) a plurality of scanner boards, each of which is connected to the scanner bus, provides system pins on a fixture edge thereof connected to the fixture, and further provides at least one instrument port on a separate instrument edge thereof connected to the scanner edge of a respective one of the instrument boards for electrical communication between the instrument ports of the scanner board and its respective instrument board, each scanner board further containing scanner switches connected selectively to perform coupling and uncoupling between the instrument ports and the system pins, at least one of the scanner boards including a switch thereon so connected as selectively to couple and uncouple an instrument port thereof to and from a signal conduction path on the scanner bus, at least one other scanner board including a switch thereon so connected as selectively to couple and uncouple a system pin thereof to and from the signal conduction path on the scanner bus.

* * * * *

UNITED STATES PATENT AND TRADEMARK OFFICE
CERTIFICATE OF CORRECTION

PATENT NO.  : 5,101,150
DATED       : March 31, 1992
INVENTOR(S) : Robert C. Sullivan et al.

It is certified that error appears in the above-identified patent and that said Letters Patent is hereby corrected as shown below:

In column 11, line 29, delete "instrument board is" and insert
— instrument drives and/or senses under control of the instrument-control signals, each instrument board being —.

Signed and Sealed this

Twenty-seventh Day of October, 1998

Attest:

BRUCE LEHMAN

Attesting Officer

Commissioner of Patents and Trademarks